(12) United States Patent
Hsu et al.

(10) Patent No.: US 11,355,318 B2
(45) Date of Patent: Jun. 7, 2022

(54) ADJUSTABLE FASTENING DEVICE FOR PLASMA GAS INJECTORS

(71) Applicant: Taiwan Semiconductor Manufacturing Co., Ltd., Hsinchu (TW)

(72) Inventors: Yung-Shun Hsu, Hsinchu (TW); Ching-Yu Chang, Hsinchu (TW); Chiao-Kai Chang, Hsinchu (TW); Wai Hong Cheah, Hsinchu (TW); Chien-Fang Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/072,866

(22) Filed: Oct. 16, 2020

(65) Prior Publication Data

US 2021/0043423 A1 Feb. 11, 2021

Related U.S. Application Data

(62) Division of application No. 16/007,780, filed on Jun. 13, 2018, now Pat. No. 10,840,066.

(51) Int. Cl.
*H01J 37/32* (2006.01)
*H01L 21/66* (2006.01)
(Continued)

(52) U.S. Cl.
CPC ....... *H01J 37/3244* (2013.01); *H01J 37/3211* (2013.01); *H01J 37/32715* (2013.01);
(Continued)

(58) Field of Classification Search
CPC .............. H01J 37/3244; H01J 37/3211; H01J 37/32715; H01J 37/32963;
(Continued)

(56) References Cited

U.S. PATENT DOCUMENTS 6,013,155 A * 1/2000 McMillin .............. C23C 16/455
  118/723 I
6,230,651 B1 * 5/2001 Ni ....................... H01J 37/3244
  118/723 I
(Continued)

FOREIGN PATENT DOCUMENTS

CN 101414537 A 4/2009
CN 101529997 A 9/2009
(Continued)

*Primary Examiner* — Shahed Ahmed
*Assistant Examiner* — Khatib A Rahman
(74) *Attorney, Agent, or Firm* — Seed IP Law Group LLP

(57) ABSTRACT

An embodiment is an apparatus, such as a plasma chamber. The apparatus includes chamber walls and a chamber window defining an enclosed space. A chamber window is disposed between a plasma antenna and a substrate support. A gas delivery source is mechanically coupled to the chamber window. The gas delivery source comprises a gas injector having a passageway, a window at a first end of the passageway, and a nozzle at a second end of the passageway. The nozzle of the gas delivery source is disposed in the enclosed space. A fastening device is mechanically coupled to the gas delivery source. The fastening device is adjustable to adjust a sealing force against the gas injector.

20 Claims, 8 Drawing Sheets

(51) Int. Cl.
  *H01L 21/67* (2006.01)
  *H01L 21/683* (2006.01)
  *H01L 21/3065* (2006.01)
  *H01L 21/311* (2006.01)
  *H01L 21/3213* (2006.01)

(52) U.S. Cl.
  CPC .. H01J 37/32963 (2013.01); H01L 21/67069 (2013.01); H01L 22/26 (2013.01); *H01J 2237/20214* (2013.01); *H01J 2237/334* (2013.01); *H01L 21/3065* (2013.01); *H01L 21/31116* (2013.01); *H01L 21/31138* (2013.01); *H01L 21/32136* (2013.01); *H01L 21/67167* (2013.01); *H01L 21/6831* (2013.01)

(58) Field of Classification Search
  CPC ....... H01J 2237/20214; H01J 2237/334; H01J 37/32513; H01J 2237/3341; H01L 21/6831; H01L 21/3065; H01L 21/67069; H01L 22/26; H01L 21/31116; H01L 21/31138; H01L 21/32136; H01L 21/67167; H01L 21/67201
  See application file for complete search history.

(56) References Cited

U.S. PATENT DOCUMENTS

| | | |
|---|---|---|
| 6,493,375 B1 | 12/2002 | Kodeda et al. |
| 7,928,366 B2 | 4/2011 | Bogart et al. |
| 8,262,846 B2 | 9/2012 | Nogami et al. |
| 8,475,625 B2 | 7/2013 | Pamarthy et al. |
| 8,800,484 B2 | 8/2014 | Matsumoto et al. |
| 8,828,182 B2 | 9/2014 | Detmar et al. |
| 9,051,647 B2 | 6/2015 | Cooperberg et al. |
| 9,162,236 B2 | 10/2015 | Nangoy et al. |
| 9,767,993 B2 | 9/2017 | Ishibashi et al. |
| 9,904,013 B2 | 2/2018 | Schultheis et al. |
| 10,163,606 B2 | 12/2018 | Rozenzon et al. |
| 10,403,475 B2 | 9/2019 | Cooperberg et al. |
| 2003/0070620 A1* | 4/2003 | Cooperberg ...... C23C 16/45574 118/723 AN |
| 2004/0082251 A1* | 4/2004 | Bach ................ C23C 16/52 445/60 |
| 2004/0126952 A1* | 7/2004 | Gondhalekar .... H01L 21/67017 438/200 |
| 2006/0113038 A1* | 6/2006 | Gondhalekar ...... C23C 16/4558 156/345.33 |
| 2011/0253044 A1* | 10/2011 | Tam ................. C23C 16/45519 118/666 |
| 2012/0305190 A1* | 12/2012 | Kang ................ C23C 16/45563 156/345.34 |
| 2014/0273301 A1* | 9/2014 | Lu ................... H01L 21/3065 438/14 |
| 2015/0280281 A1 | 10/2015 | Farmer |
| 2015/0371824 A1* | 12/2015 | Lane ................. H01J 37/3211 216/67 |
| 2015/0380281 A1* | 12/2015 | Sriraman ......... H01L 21/32136 438/710 |
| 2017/0009338 A1 | 1/2017 | Saito et al. |
| 2017/0183777 A1 | 6/2017 | Ikegawa et al. |
| 2018/0108578 A1 | 4/2018 | Pandev et al. |
| 2018/0230624 A1 | 8/2018 | Dube et al. |
| 2019/0385816 A1* | 12/2019 | Hsu ................. H01J 37/32715 |

FOREIGN PATENT DOCUMENTS

| | | |
|---|---|---|
| CN | 102763199 A | 10/2012 |
| CN | 104170067 A | 11/2014 |
| CN | 106415123 A | 2/2017 |
| CN | 107221487 A | 9/2017 |

* cited by examiner

ADJUSTABLE FASTENING DEVICE FOR PLASMA GAS INJECTORS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing equipment are needed. In one example, a plasma processing system is utilized to perform plasma etching process of a substrate. During a plasma etching process, a plasma generates volatile etch products from the chemical reactions between the elements of the material etched from the surface of the substrate and the reactive species generated by the plasma.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
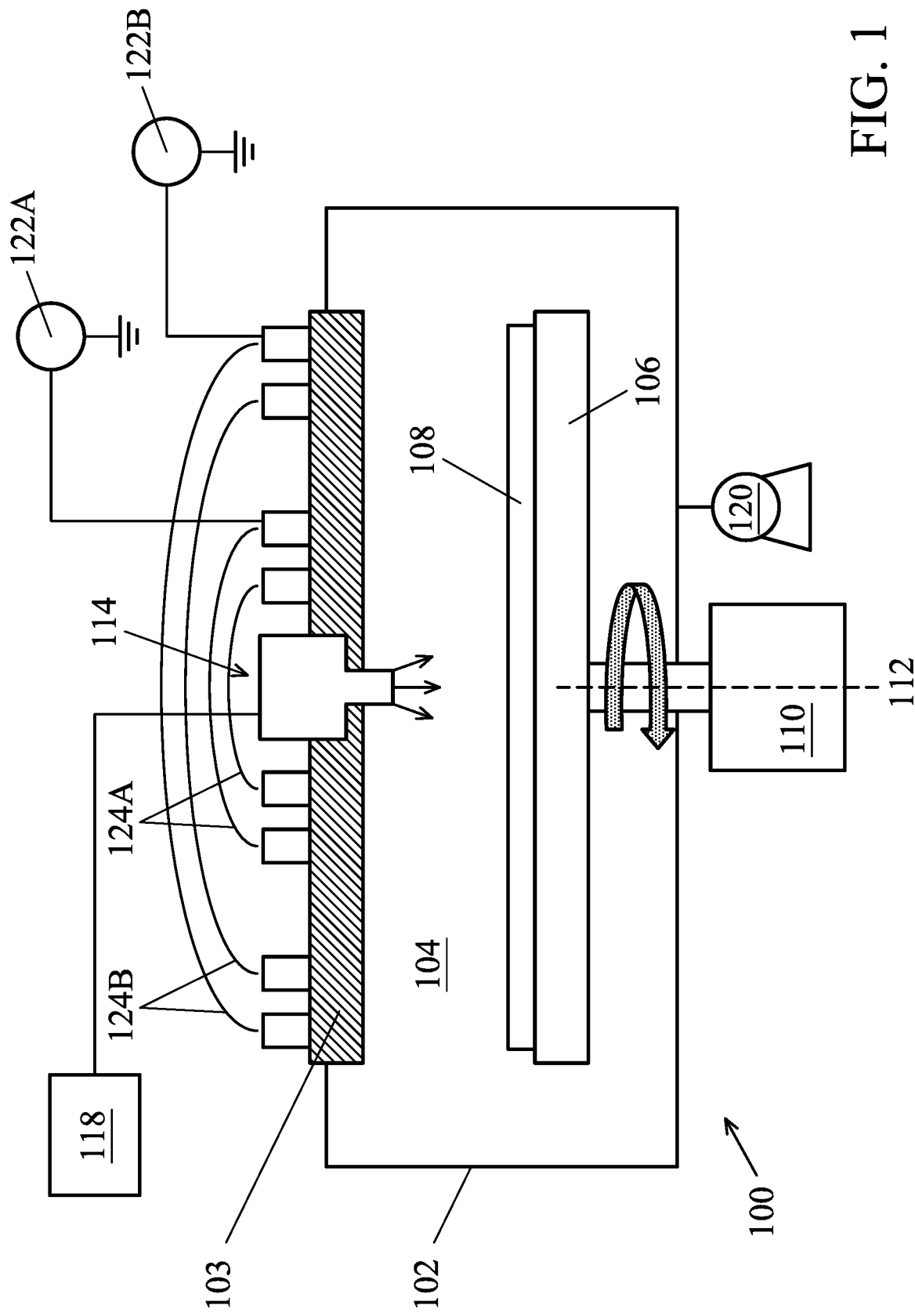
FIG. 1 illustrates a schematic cross-sectional view of a plasma chamber for integrated circuit fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Certain embodiments provide an IC fabrication system and a method utilizing the same. By utilizing the disclosed IC fabrication system, the plasma process (such as plasma etching) quality and efficiency can be improved. The IC fabrication system includes one or more plasma chambers, each further including one or more gas delivery sources with an adjustable fastening device. The adjustable fastening device includes multiple sets of fasteners, each further including a bolt and a nut. Each fastener may be individually adjusted to accommodate any type of gas injectors and to tune a fastening force to secure a gas injector cover to a gas injector with enhanced sealing effect between a seal and a window to reduce or to eliminate leaking of the gas injector. Certain embodiments provide the adjustable fastening device to reduce or eliminate leaking of the gas injectors due to different types of gas injectors. Leaking of the gas injectors may cause erroneous detection of a process endpoint by an endpoint detector and/or may impact substrate process uniformity. By avoiding leaking of the gas injector, maintenance and cost of the plasma chamber may be reduced and the uptime of the plasma chamber may be increased.

FIG. 1 illustrates a schematic cross-sectional view of a plasma chamber 100 for integrated circuit (IC) fabrication, in accordance with some embodiments. The plasma chamber 100 includes chamber walls 102 and a chamber window 103 defining an enclosed space 104 for processing of substrates 108. The enclosed space 104 is isolated from the outside environment and can be maintained at a suitable state, such as vacuum or a below atmospheric pressure.

In certain embodiments, the plasma chamber 100 is operable to perform a plasma etch process, such as plasma etching of metal, dielectric, semiconductor, and/or mask materials from the surface of the substrate 108. In certain embodiments, the plasma chamber 100 is operable to perform a deposition process, such as plasma deposition of metal, dielectric, semiconductor, and/or mask materials over the surface of the substrate 108. In certain embodiments, the plasma chamber 100 is operable to perform a plasma treatment, such as plasma treatment of metal, dielectric, semiconductor, and/or mask materials on the surface of the substrate 108.

The plasma chamber 100 includes a substrate support 106 provided within the chamber walls 102 to support the substrate 108. The substrate 108 may be a silicon wafer. In other embodiments, the substrate 108 may comprise other elemental semiconductor materials, compound semiconductor materials, alloy semiconductor materials, or other semiconductor wafers, and other suitable substrates. Examples of compound semiconductor materials include, but are not limited to, silicon carbide, gallium arsenic, gallium phosphide, indium phosphide, indium arsenide, and/or indium antimonide. Examples of alloy semiconductor materials include, but are not limited to, SiGe, GaAsP, AlInAs, AlGaAs, GaInAs, GaInP, and/or GaInAsP.

The substrate support 106 may include an electrostatic chuck and/or a clamp ring (not shown) to hold the substrate 108 during processing. The substrate support 106 may also have cooling and/or heating elements (not shown) to control the temperature of the substrate support. The substrate support 106 may also provide backside gas to the substrate 108 to increase heat transfer between the substrate 108 and the substrate support 106.

The substrate support 106 may be coupled to a rotation device 110, such as a motor, to rotate the substrate support 106 and the substrate 108 around a rotation axis 112 during substrate processing. Rotation of the substrate 108 helps to provide uniform processing of the substrate.

The plasma chamber 100 includes one or more gas delivery sources 114 coupled to the chamber window 103. The gas delivery source 114 is connected to a gas supply source 118 and is adapted to provide a processing gas to the substrate 108. In various examples, the processing gas is an etching gas, a deposition gas, a treatment gas, a carrier gas, (such as nitrogen, argon, etc.), other suitable gases, and combinations thereof. The gas delivery source 114 injects the processing gas into the enclosed space 104.

The plasma chamber 100 includes a pumping module 120 coupled to the enclosed space 104 and operable to maintain the enclosed space 104 at a vacuum state or at below atmospheric pressure, such as below about 5 Torr. In certain embodiments, the pumping module 120 is operable to maintain the enclosed space 104 to a pressure in a range from about 1 mTorr to about 100 mTorr. In various examples, the pumping module 120 may include one or more pumps, and may utilize multiple pumping technologies, such as a positive displacement pump, momentum transfer pump, regenerative pump, and/or entrapment pump. Various pumps may be configured in series according to respective working ranges.

The plasma chamber 100 includes a plasma power source 122, such as a radio frequency (RF) power source 122, coupled to a plasma antenna, such as a coil 124 for an inductively coupled plasma, to maintain a plasma inside the enclosed space 104. In other embodiments, the plasma antenna may include plates for a capacitively coupled plasma. The RF power source 122 is coupled to the coil 124 through suitable RF impedance matching circuitry (not shown). The coil 124 is posited over the chamber window 103. The chamber window 103 comprises a dielectric window to permit an RF energy provided by the plasma power source 122 from the coil 124 to the enclosed space 104. The RF energy of the coil 124 is operable to maintain an inductively coupled plasma from the processing gas within the enclosed space 104 for etching, deposition, and/or plasma treatment of the substrate 108. The plasma power source 122 of the plasma chamber 100 may include a first plasma power source 122A coupled to an inner coil 124A and a second plasma power source 122B coupled to an outer coil 124B. The first plasma power source 122A and the second plasma power source 122B may separately control the RF energy provided to the respective inner coil 124 and the outer coil 124B to control the plasma to an inner and outer region of the substrate 108. In certain embodiments, the coil 124 maintains the plasma at a high density state, such as a plasma density in a range from about $10^9$ ions/cm$^3$ to about $10^{12}$ ions/cm$^3$, such as from about $10^{10}$ ions/cm$^3$ to about $10^{12}$ ions/cm$^3$. The coil 124 may be a planar multi-turn spiral coil, a non-planar multi-turn spiral coil, or a coil having another appropriate shape. In other embodiments, the plasma can be maintained by other plasma antennas, such as electron cyclotron resonance (ECR), parallel plate, helicon, helical resonator, or other plasma antennas.

Figure 2:
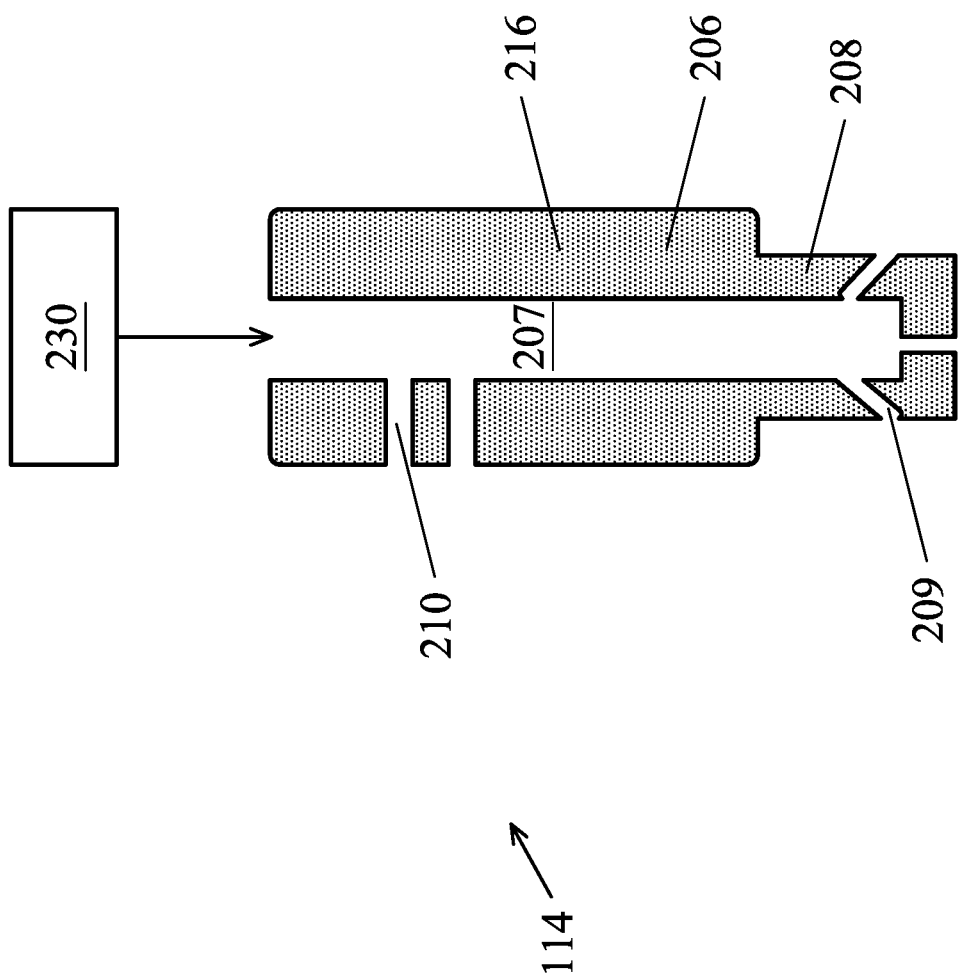
FIG. 2 illustrates a schematic cross-sectional view of a gas delivery source, in accordance with some embodiments.

FIG. 2 illustrates a schematic cross-sectional view of the gas delivery source 114 comprising a gas injector 216, in accordance with some embodiments. The gas injector 216 includes a cylindrical body 206 having a passageway 207 for the processing gas to flow to a gas injector head 208 configured on one end of the cylindrical body 206. The gas injector 216 can be made of metal materials (such as aluminum or stainless steel), dielectric materials (such as quartz, alumina, silicon nitride), or other suitable materials.

The gas injector head 208 includes one or more nozzles 209. The processing gas is delivered to the gas injector 216 from the gas supply source 118 of FIG. 1 through one or more inlets 210 that couples the gas supply source 118 to the gas injector 216. The gas injector 216 delivers the processing gas through the passageway 207 and out of the nozzles 209 to the enclosed space 104 of FIG. 1.

The number of nozzles 209 and/or the angle of nozzles 209 can be selected to provide desired gas distribution in a particular substrate processing regime. For instance, the number, size, angle of injection of processing gas and/or location of the nozzles 209 within the chamber can be adapted to a particular coil used to inductively couple RF energy into the plasma chamber 100.

The nozzles 209 can have any desired shape, such as uniform diameter along the entire length thereof, or other shape, such as conically tapered, flared surfaces or radially contoured surfaces. The nozzles 209 can be oriented to inject the gas in any direction, including directly at the substrate 108, at an acute angle with respect to the substrate 108, parallel to the substrate 108 or back toward the upper plasma boundary surface (at an oblique angle with respect to the longitudinal axis of the nozzle 209), or combinations thereof. It may be desired to achieve a uniform flux of process gas and plasma species onto the substrate surface to facilitate uniform processing rates across the substrate 108. Additional gas injectors can also be provided near the periphery of the substrate or from other chamber walls 102.

The gas delivery source 114 may be disposed within the center of the inner coil 124A and may be disposed through the chamber window 103. In the plasma chamber 100 in which a coil is used to maintain an inductively coupled plasma in the enclosed space 104, the location of the gas injector 216 in the center of the coil 124A avoids exposure of the gas injector 216 to the toroidal zone of plasma formed by the coils 124A, 124B. The nozzles 209 are located in a region of reduced electric field strength at which there is reduced plasma induced reactant decomposition. If the gas injector is disposed away from the center of the coil 124, electric field lines (created by the difference in potential between the plasma and the gas injector 216) may be large and may lead to locally enhanced deposition during etching or deposition clogging the nozzles 209 of gas injectors 216 located away from the center of the inner coil 124A. For the gas injector located at or near the center of the inner coil 124A, electric field lines are smaller and reduce the susceptibility of the nozzles 209 of the gas injector 216 from clogging, such as after successive plasma processing of the substrate 108.

Different gas injectors 216 may be used for different process regimes. Using different gas injectors 216 allow for selection of the center gas feed location and the distance of the substrate 108 from the nozzles 209. A certain gas injector 216 may position the nozzles 209 close to the substrate 108 or far from the substrate 108 to tailor the transport of plasma species to the substrate 108. A certain gas injector 216 may be selected based upon utilization of the processing gas in a certain process regime. Processing gas delivery from the center of an inner coil 124 allows for efficient utilization of the processing gas with minimal disturbance to plasma uniformity. The nozzles 209 may be small in diameter so that a plasma sheath formed around the gas injector 216 is largely unaffected by the presence of the nozzles. The gas injector 216 can facilitate efficient transport of processing by-products out of the substrate region, which can favorably impact processing uniformity and profile control, such as in chemically driven applications such as metal etching. The delivery of processing gas to various regions above the substrate 108 can be tailored by utilizing various diameters and various positions of the nozzles 209 for different gas injectors 216.

In other embodiments, one or more gas injectors 216 can be provided in the chamber window 103 and/or more one or more gas injectors 216 can be provided at the side of the chamber walls 102.

An endpoint detector 230 may be directed through the passageway 207 of the gas injector 216 to monitor electromagnetic signals emanating from the enclosed space 104 of the plasma chamber 100 of FIG. 1. The electromagnetic signals may be visible, infrared, ultraviolet (UV) light, X-ray light, and/or other electromagnetic signals emitting from a plasma within the enclosed space 104. The endpoint detector 230 can determine certain process conditions within the plasma chamber 100 from monitoring the electromagnetic signals. For example, the electromagnetic signals may indicate a presence of a plasma, a presence of process gas species, a presence of etching/deposition residual materials, or other process information.

Figure 3:
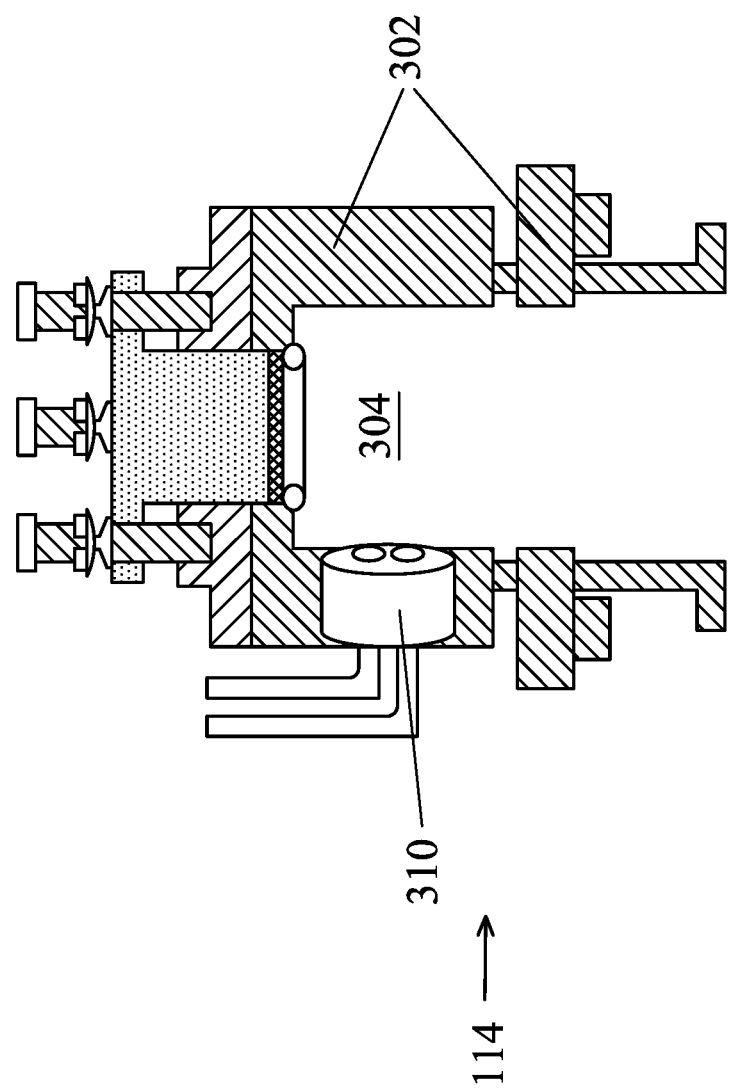
FIG. 3 illustrates a schematic cross-sectional view of a gas delivery source further comprising a fixture to attach and secure a gas injector onto a chamber window of a plasma chamber, in accordance with some embodiments.

FIG. 3 illustrates a schematic cross-sectional view of the gas delivery source 114 further comprising a fixture 302 to attach and secure the gas injector 216 of FIG. 2 onto the chamber window 103 of the plasma chamber 100 of FIG. 1, in accordance with some embodiments. The fixture 302 includes a cavity 304 to house the gas injector 216. The fixture 302 includes one or more inlets 310 to delivery the processing gas from the gas supply source 118 of FIG. 1 to the one or more inlets 210 of the gas injector 216. The fixture 302 attaches onto the chamber window 103 using clamps, screws, bolts, or other fasteners. In other embodiments, the gas injector 216 can be brazed, sintered, or otherwise bonded into an opening in the chamber window 103. In other embodiments, the chamber window 103 and the gas injector 216 can be formed together by sintering a ceramic powder, such as $Al_2O_3$ or $Si_3N_4$. In other embodiments, the gas injector 216 can be machined or otherwise formed in the chamber window 103.

Figure 4:
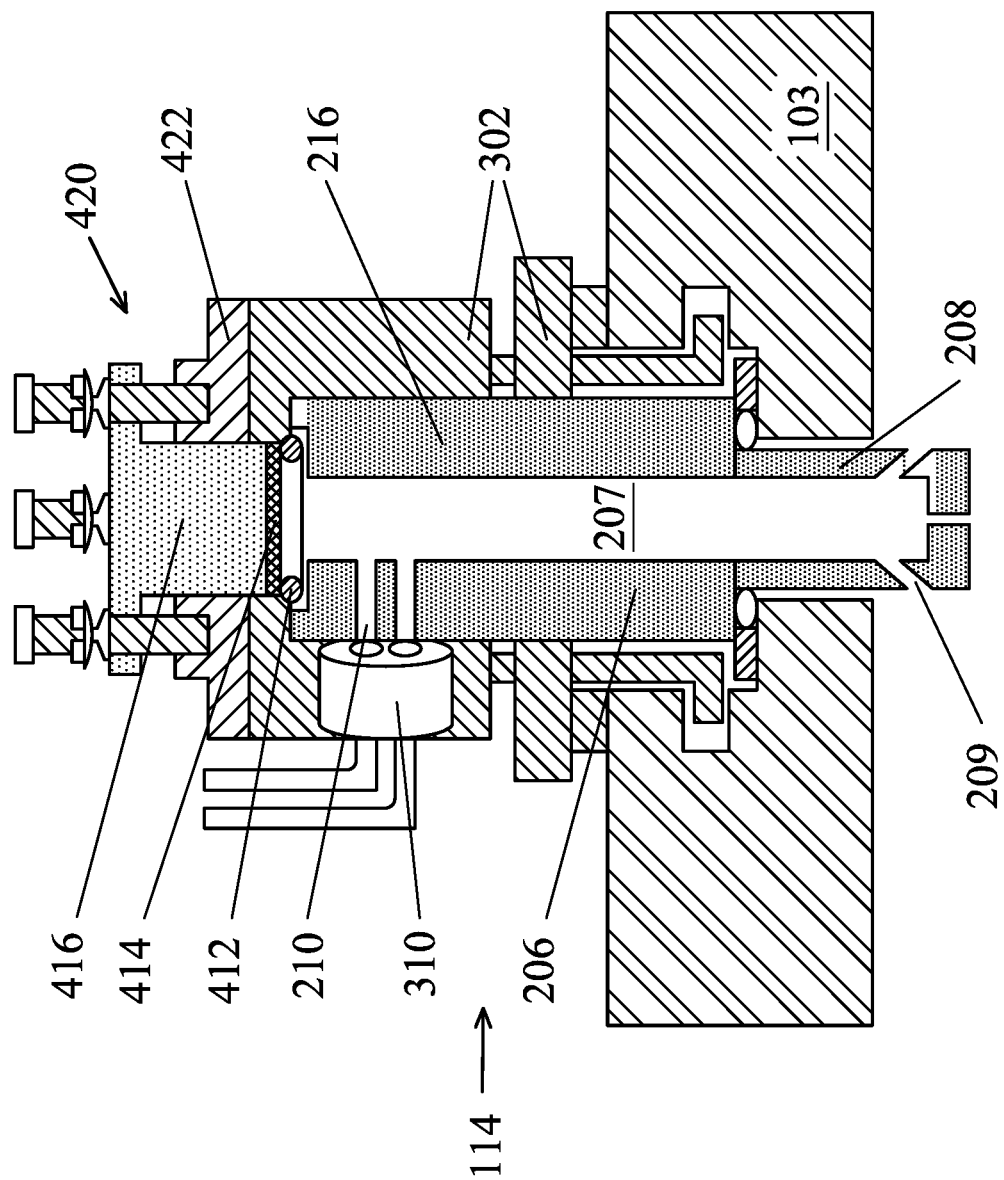
FIG. 4 illustrates a schematic cross-sectional view of a gas delivery source attached to a chamber window of a plasma chamber, in accordance with some embodiments.

FIG. 4 illustrates a schematic cross-sectional view of the gas delivery source 114 attached to the chamber window 103 of the plasma chamber 100 of FIG. 1, in accordance with some embodiments. The gas delivery source 114 comprises the gas injector 216 housed within the fixture 302. The gas delivery source 114 further comprises an adjustable fastening device 420. The adjustable fastening device 420 includes a base plate 422 and a gas injector cover 416. The gas injector cover 416 provides a sealing force to a window 414, such as a transparent window. The window 414 is disposed between the gas injector cover 416 and the cylindrical body 206 of the gas injector 216. A seal 412, such as an O-ring seal, may be disposed between the window 414 and the cylindrical body 206 of the gas injector 216, such as in a seal groove or O-ring groove. The gas injector cover 416 provides a sealing force to the window 414 against the seal 412 to reduce or eliminate air or ambient gases leaking through the top of the gas injector 216 and into the plasma chamber 100. Undesirable leaking of air or ambient gases into the plasma chamber 100 may cause process drift on the substrates 108 and may result in non-uniform processing of the substrates 108 within the plasma chamber 100.

The window 414 may be transparent to receive signals through the passageway 207. For example, the window 414 may be made of a polymer, quartz, sapphire, and/or dielectric material transparent to electromagnetic signals, such as visible, infrared, UV light, X-ray light, and/or other electromagnetic signals. The electromagnetic signals through the window 414 may be used to monitor the process conditions within the plasma chamber, such as the presence of a plasma, the presence of process gas species, and/or the presence of etching/deposition residual materials. The window 414 may comprise any suitable shape, such as a round plate.

In certain embodiments, the gas injector cover 416 may include a central bore to permit reception of electromagnetic signals through the window 414 to an endpoint detector 230. In other embodiments as shown in FIG. 4, the gas injector cover 416 may not have a central bore when monitoring electromagnetic signals through the window 414 is not conducted.

The gas injector 216, the fixture 302, and/or the gas injector cover 416 may be made of a polymer, a metal, a dielectric material, a quartz material, a ceramic material, other suitable materials, and combinations thereof. Examples of suitable polymers include fluoropolymers, polyetherimide, polycarbonate, polyetheretherketone (PEEK), polyimide, and other suitable polymers. Examples of ceramic material include alumina, ceria, yttria, zirconia, and other suitable ceramic materials.

Figure 5:
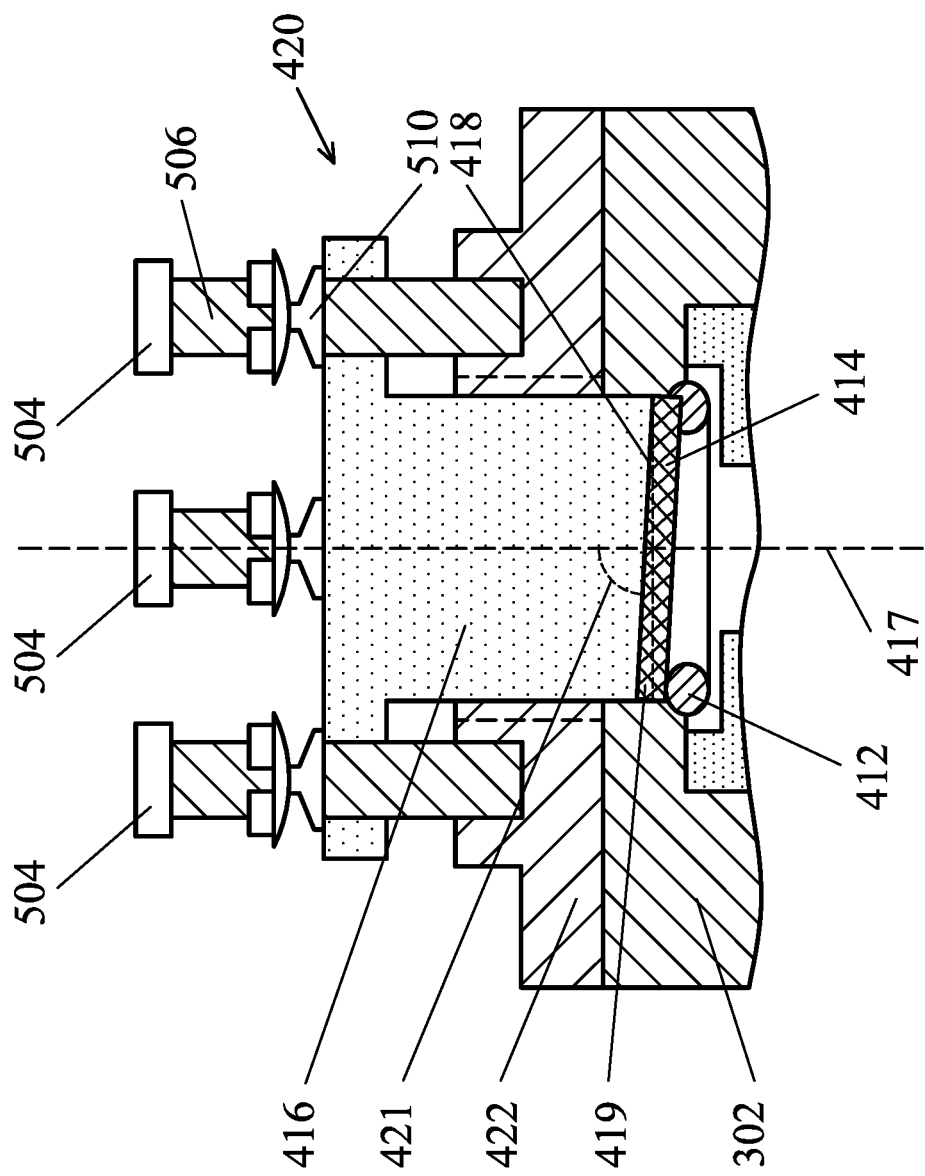
FIG. 5 illustrates a schematic cross-sectional view of an adjustable fastening device, in accordance with some embodiments.

FIG. 5 illustrates a schematic cross-sectional view of the adjustable fastening device 420, in accordance with some embodiments. The adjustable fastening device 420 includes fasteners 504, such as sets of bolts and nuts. Three fasteners 504, in which each fastener 504 includes a bolt 506 and a nut 510, are shown in FIG. 5 although other types and other number of fasteners may be used. The bolt 506 is disposed through the gas injector cover 416 and is coupled through threads in the bolt 506 to the base plate 422. The base plate 422 is coupled to the fixture 302. The nuts 510 may be adjusted to control the height of the gas injector cover 416. Controlling the height of the gas injector cover 416 controls a bottom surface 418 of the gas injector cover 416 abutting the window 414 against the seal 412 to provide a controllable sealing force. Each fastener 504 may be separately adjusted to adjust the height of the gas injector cover 416. The gas injector cover 416 provides a sealing force against the window 414 to compress the seal 412. The separate adjustment of each fastener enables or eliminates leaking through the window 414.

In certain embodiments, the bottom surface 418 of the gas injector cover 416 is sloped at an angle 419 to match the slope of the window 414 against the seal 412 housed in the seal groove of the cylindrical body 206 of the gas injector 216. In certain embodiments, the bottom surface 418 is sloped at an angle 419 in a range from about 1° to about 10° from horizontal. In some examples, the gas injector cover 416 has a longitudinal axis 417 (e.g., around which the gas injector cover 416 is substantially laterally symmetrical) that intersects the bottom surface 418, and an angle 421 formed by the intersection of the longitudinal axis 417 and the bottom surface 418 can be in a range from about 80° to about 89°. In certain embodiments, the sloped bottom surface 418 of the gas injector cover 416 enhances sealing of the window 414 against the seal 412.

The adjustable fastening device 420 may accommodate different gas injectors 216. For example, different gas injectors 216 having different nozzles 209 may be used in an integrated circuit fabrication factory. The adjustable fastening device 420 can be used as universal or single type of device to adjust the height of the gas injector cover 416 of different gas injectors 216 to reduce or to eliminate leaking through the window 414.

Without an adjustment device, sufficient fastening forces may not be able to seal the window 414 against the seal 412 leading to leaking between the window 414 and the seal 412. With the adjustable fastening device 420, each fastener 504 can be independently and individually tuned with corresponding height and distance at the corresponding location to achieve the optimized sealing effect between the seal 412 and the window 414, thereby reducing or eliminating leakage.

Figure 6:
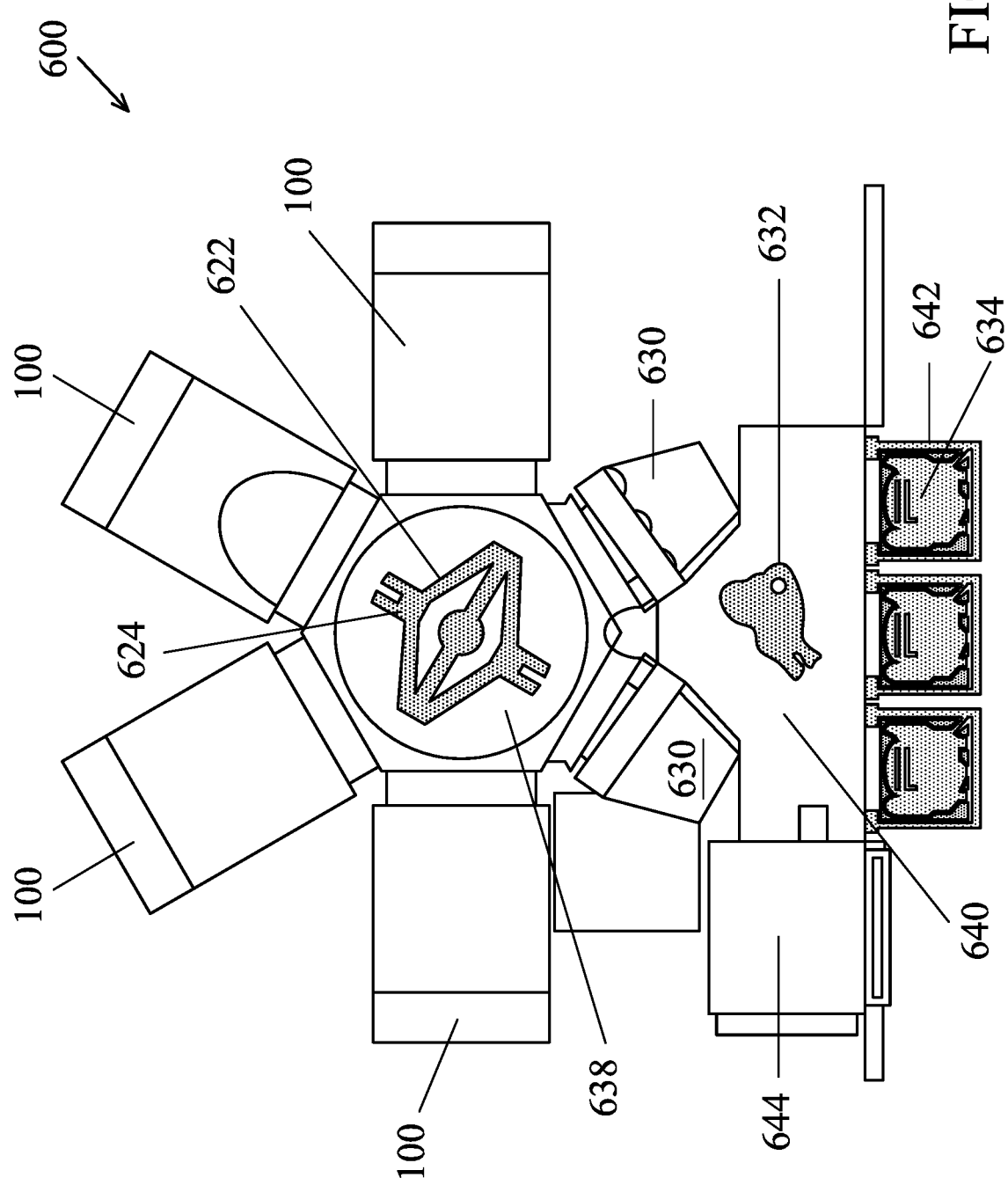
FIG. 6 illustrates a schematic top view of an integrated circuit (IC) fabrication system, in accordance with some embodiments.

FIG. 6 illustrates a schematic top view of an integrated circuit (IC) fabrication system 600, in accordance with some embodiments. The IC fabrication system 600 includes one or more plasma chambers 100 of FIG. 1 integrated together in a cluster tool. The plasma chamber 100 includes one or more gas delivery sources 114 of FIG. 4 each having an adjustable fastening device 420 to fasten the gas injector cover 416 against the window 414 to provide enhanced sealing effect to the interface between the window 414 and the seal 412.

The IC fabrication system 600 includes a load port module 642 comprising a plurality of Front Opening Unified Pods (FOUPs) 634, through which substrates are loaded and unloaded to and from the IC fabrication system 600. The IC fabrication system 600 may include a front-end robot 632 in an atmospheric pressure transfer module 640, for holding, manipulating and transferring substrates. For example, the front-end robot 632 may transfer substrates from the FOUPs 634 to a substrate aligner 644 and to one of the load lock chambers 630.

The IC fabrication system 600 may further include a transfer module 638 for transferring substrates between the plasma chambers 100 and the load lock chambers 630. In some embodiments, the transfer module 638 further includes one or more robot 622 for transferring substrates on one or more substrate end effectors 624.

Figure 7:
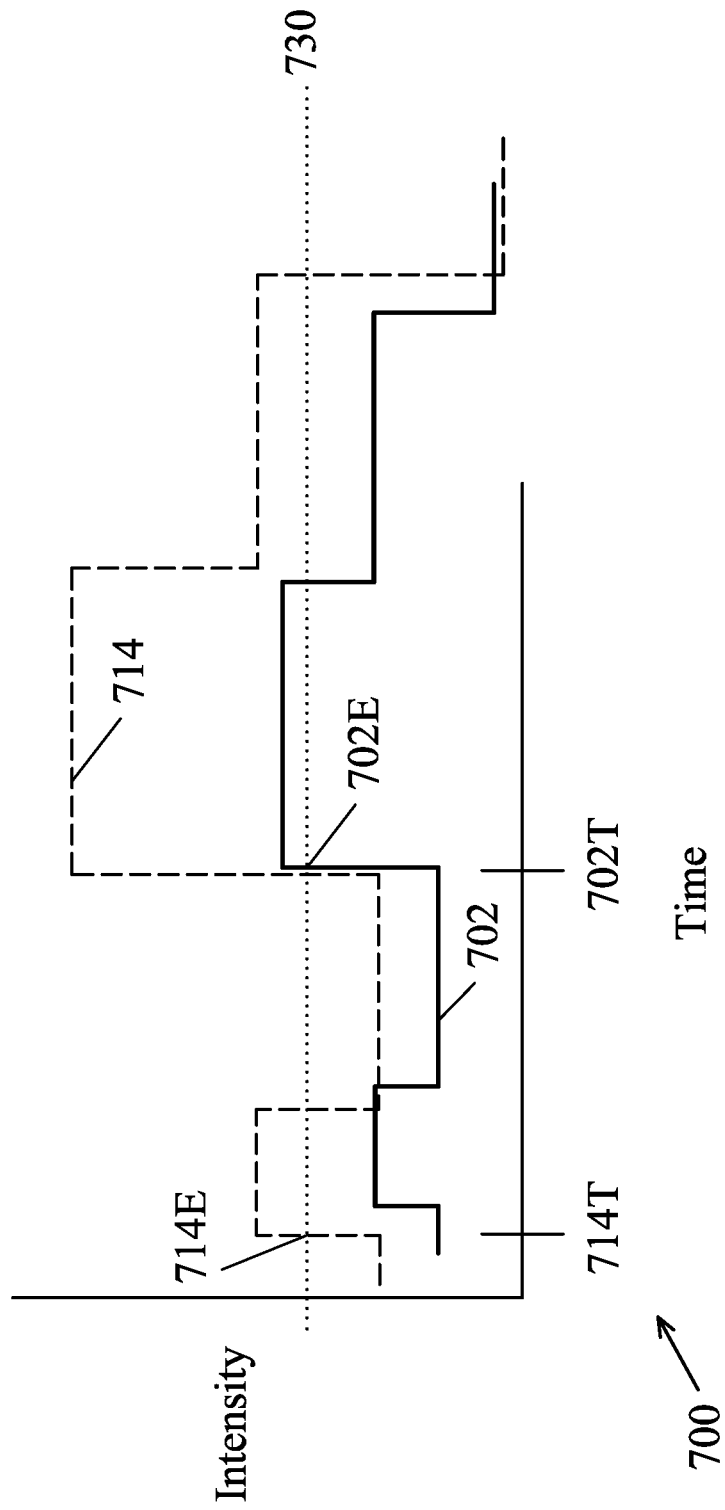
FIG. 7 is a graph of a signal monitored by an endpoint detector, in accordance with some embodiments.

FIG. 7 is a graph 700 of a signal monitored by the endpoint detector 230 of FIG. 2, in accordance with some embodiments. The endpoint detector 230 may monitor an intensity of a signal of a certain wavelength or a range of wavelengths over a processing time of a substrate.

Line 702 represents the intensity of the signal when the plasma chamber 100 is in proper operating condition without a leak in the gas delivery source 114 utilizing the adjustable fastening device 420. In an example, intensity crossing a threshold 730 indicates the end of the process, such as the end of an etching process. At point 702E, the end of the process is detected by the endpoint detector 230 at time 702T.

Line 714 represents the intensity of the signal when the plasma chamber 100 is operating under a leak in the gas delivery source 114 with an adjustable fastening device 420. At point 714E, the end of the process is erroneously detected by the endpoint detector 230 as crossing threshold 730 at time 714T. The intensity of the signal operating under a leak indicates the end of the process too early at time 714T in comparison to the actual end of the process at time 702T. The IC fabrication system 600 with the plasma chamber 100 having a leak in the gas delivery source 114 may have undesirable process drift or erroneous detection of an endpoint.

Figure 8:
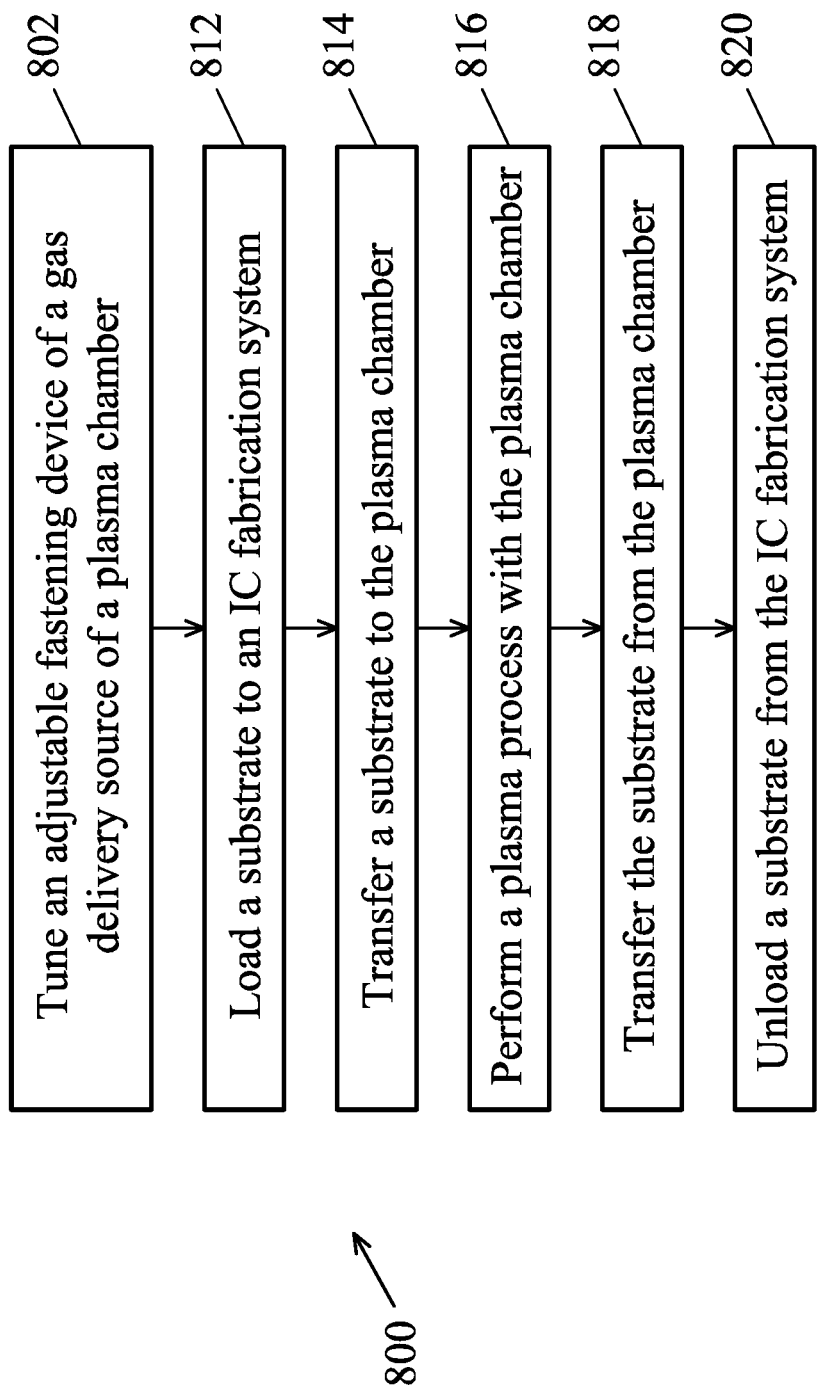
FIG. 8 is a flowchart of a method of processing one or more substrates, in accordance with some embodiments.

FIG. 8 is a flowchart of a method 800 of processing one or more substrates 108, in accordance with some embodiments. The method 800 is implemented in the IC fabrication system 600 of FIG. 6 and is described with reference to FIGS. 1-7.

The method 800 includes an operation 802 to tune the adjustable fastening device 420 of the gas delivery source 114. The adjustable fastening device 420 includes multiple sets of fasteners 504, each further including a bolt 506 and a nut 510. The operation 802 includes disposing the gas injector cover 416 over the base plate 422 such that the fasteners 504 coupled the gas injector cover 416 to the base plate 422. The operation 802 includes adjusting the height of the gas injector cover 416 or controlling the depth of a bottom surface 418 of the gas injector cover 416. The height of the gas injector cover 416 may be adjusted by tuning the nuts 510 to adjust a sealing force between the window 414 and the seal 412 against the gas injector 216. Adjusting the height of the gas injector cover 416 reduces or eliminates leaking through the interface between that the seal 412 and the window 414.

The operation 802 may be repeated to tune the adjustable fastening device 420 to one plasma chamber 100 on one IC fabrication system 600, to multiple plasma chambers 100 on one IC fabrication system 600, and/or to multiple plasma chambers 100 on multiple IC fabrication systems 600. The adjustable fastening device 420 may adjust the sealing force of the seal 412 and the window against multiple types of gas injector 216 used on multiple plasma chambers 100.

In operation 812, the substrates 108 are loaded to the IC fabrication system 600. For example, one or more semiconductor wafers are loaded to the IC fabrication system 600 through the load port module 642, such as in one or more batches in FOUPs 634. The substrates 108 are loaded into the IC fabrication system 600 through the load port module 642 to one or more of the load lock chambers 630.

In operation 814, the substrates 108 are transferred from the load lock chamber 630 to one of the plasma chambers 100 by the robot 622. In operation 816, a plasma process is performed in the plasma chamber 100 to the substrate 108. For example, a processing gas is delivered from the gas supply source 118 to the gas injector 216 of the plasma chamber 100. A plasma is maintained from the processing gas in the enclosed space 104 by providing a RF power to the coil 124. For example, in an etching process, the process gas may include, but not limited to, tetrafluoromethane ($CF_4$), other carbon fluorides, chlorine gas ($Cl_2$), nitrogen trifluoride ($NF_3$), sulfur hexafluoride ($SF_6$), hydrogen bromide (HBr), hydrogen chloride (HCl), chlorine ($Cl_2$), and other suitable gases. For example, in a deposition process of silicon materials, the process gas may include silane ($SiH_4$), $SiH_2Cl_2$ (dichlorosilane), or other silicon precursors. For example, in a treatment process, the process gas may include hydrogen ($H_2$), nitrogen ($N_2$), oxygen ($O_2$), or other gases.

The process gas may also include carrier gases such as nitrogen ($N_2$), argon (Ar), helium (He), or combinations thereof.

In operation 818, the substrates 108 are transferred from the plasma chamber 100 to the load lock chambers 630 by the robot 622. This operation is similar to the operation 814 but is reversed in order.

In operation 820, the substrates 108 are unloaded from the IC fabrication system 600 through the load port module 642. The method 800 may include other operations, before, during or after the operations described above. For example, after the operation 820, the substrates 108 may be transferred to other fabrication tools for other processing steps.

The IC fabrication system 600 and the method 800 may have other embodiments, or alternatives. The IC fabrication system 600 and the method utilizing the same may be used to conduct one or a combination of plasma process operations, such as etching, deposition, and treatment.

Certain embodiments provide an IC fabrication system and a method utilizing the same. By utilizing the disclosed IC fabrication system, the plasma process, such as plasma etching quality and efficiency are improved. The IC fabrication system includes one or more plasma chambers 100, each further including one or more gas delivery sources 114 with an adjustable fastening device 420. The adjustable fastening device 420 includes multiple sets of fasteners 504, each further including a bolt 506 and a nut 510. Each fastener 504 may be individually adjusted to accommodate any type of gas injectors 216 and to tune a fastening force to secure the gas injector cover 416 to the gas injector 216 with enhanced sealing effect between the seal 412 and the window 414, to reduce or to eliminate leaking.

Certain embodiments provide the adjustable fastening device 420 to reduce or eliminate leaking of the gas injectors 216 due to different types of gas injectors 216. Leaking of the gas injectors may cause erroneous detection of a process endpoint by the endpoint detector 230 and/or may impact substrate process uniformity. Certain embodiments provide the adjustable fastening device 420 to be used and match any gas injector 216 to reduce or eliminate leaking of the gas injector 216. By avoiding leaking of the gas injector 216, maintenance and cost of the plasma chamber 100 may be reduced and the uptime of the plasma chamber 100 may be increased.

The embodiments of the present disclosure offer advantages over existing art, though it is understood that other embodiments may offer different advantages, not all advantages are necessarily discussed herein, and that no particular advantage is required for all embodiments. Various advantages may present in some embodiments. By utilizing the disclosed IC fabrication system and the method, the IC fabrication, such as plasma etching, is improved with enhanced sealing and fabrication efficiency. Other advantages may include less manufacturing cost and higher manufacturing throughput.

An embodiment is an apparatus. The apparatus includes chamber walls and a chamber window defining an enclosed space. A chamber window is disposed between a plasma antenna and a substrate support. A gas delivery source is mechanically coupled to the chamber window. The gas delivery source comprises a gas injector having a passageway, a window at a first end of the passageway, and a nozzle at a second end of the passageway. The nozzle of the gas delivery source is disposed in the enclosed space. A fastening device is mechanically coupled to the gas delivery source. The fastening device is adjustable to adjust a sealing force against the gas injector.

Another embodiment is a method of semiconductor processing. The method includes transferring a substrate into a plasma chamber. A gas is flowed into the plasma chamber while the substrate is in the plasma chamber. The gas is flowed through a gas delivery source mechanically coupled to the plasma chamber. The gas delivery source includes a gas injector through which the gas flows into the plasma chamber. A fastening device is mechanically coupled to the gas delivery source and applies a sealing force against the gas injector. The fastening device is adjustable to adjust the sealing force. A plasma is maintained using the gas in the plasma chamber.

Still another embodiment is a gas delivery source. The gas delivery source includes a gas injector having a cylindrical body. A fixture houses the gas injector and secures the gas injector to a chamber window. A gas injector cover is disposed at one end of the cylindrical body. A window is between the gas injector cover and the cylindrical body. A seal is between the window and the cylindrical body. An adjustable fastening device is coupled to the gas injector cover. The adjustable fastening device adjusts the sealing force of the gas injector cover against the window to compress the seal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor processing, the method comprising:
    transferring a substrate into a plasma chamber;
    flowing a gas into the plasma chamber while the substrate is in the plasma chamber, the gas flowing through a gas delivery source mechanically coupled to the plasma chamber, the gas delivery source comprising a gas injector through which the gas flows into the plasma chamber and an adjustable fastening device, the gas injector including an upper terminal end and a lower terminal end and the adjustable fastening device including a gas injector cover over the upper terminal end of the gas injector;
    adjusting the adjustable fastening device to adjust a height of the gas injector cover to be in contact with a window between the gas injector cover and the upper terminal end of the gas injector;
    applying a sealing force against the upper terminal end of the gas injector, the sealing force provided by the adjustable fastening device; and
    maintaining a plasma using the gas in the plasma chamber.

2. The method of claim 1, wherein adjusting the fastening device comprises adjusting a plurality of fasteners.

3. The method of claim 2, wherein each fastener of the plurality of fasteners comprises a bolt and a nut.

4. The method of claim 1, further comprising adjusting the sealing force by adjusting the sealing force applied by the adjustable fastening device.

5. The method of claim 4, adjusting the sealing force applied by the adjustable fastening device includes adjusting a sealing force applied by the gas injector cover on the window.

6. The method of claim 5, wherein a seal is present between the window and the upper terminal end of the gas injector.

7. A method of semiconductor processing, the method comprising:
- transferring a substrate into a semiconductor processing chamber;
- flowing a gas into the semiconductor processing chamber while the substrate is in the semiconductor processing chamber, the gas flowing through a gas delivery source mechanically coupled to the semiconductor processing chamber, the gas delivery source comprising a gas injector through which the gas flows into the semiconductor processing chamber and an adjustable fastening device, the gas injector including an upper terminal end and a lower terminal end and the adjustable fastening device including a gas injector cover over the upper terminal end of the gas injector;
- adjusting the adjustable fastening device to adjust a height of the gas injector cover in contact with a window between the gas injector cover and the upper terminal end of the gas injector;
- applying a sealing force against the upper terminal end of the gas injector, the sealing force provided by the adjustable fastening device; and
- maintaining a plasma using the gas in the semiconductor processing chamber.

8. The method of claim 7, wherein adjusting the fastening device comprises adjusting a plurality of fasteners.

9. The method of claim 8, wherein each fastener of the plurality of fasteners comprises a bolt and a nut.

10. The method of claim 7, further comprising adjusting the sealing force by adjusting the sealing force applied by the adjustable fastening device.

11. The method of claim 10, wherein adjusting the sealing force applied by the adjustable fastening device includes adjusting a sealing force applied by the gas injector cover on the window.

12. The method of claim 11, wherein a seal is present between the window and the upper terminal end of the gas injector.

13. A method of semiconductor processing, the method comprising:
- transferring a substrate to a semiconductor processing system including a semiconductor processing chamber that includes a gas injector and an adjustable fastening device, the gas injector including an upper terminal end and a lower terminal end and the adjustable fastening device including a gas injector cover over the upper terminal end of the gas injector, the adjustable fastening device including multiple sets of fasteners; and
- tuning the adjustable fastening device by adjusting the fasteners so that a sealing force applied by the adjustable fastening device against the upper terminal end of the gas injector is adjusted and a height of the gas injector cover over the upper terminal end of the gas injector is adjusted.

14. The method of claim 13, wherein the gas injector cover has a bottom surface that is sloped at an angle in a range from about 80 degrees to about 89 degrees relative to a longitudinal axis of the gas injector cover.

15. The method of claim 13, further comprising maintaining a plasma using the gas in the semiconductor processing chamber.

16. The method of claim 13, wherein each fastener of the multiple sets of fasteners includes a nut and a bolt and adjusting the fasteners further comprises rotating the nut.

17. The method of claim 13, wherein each fastener of the multiple sets of fasteners includes a nut and a bolt and adjusting the fasteners further comprises rotating the bolt.

18. The method of claim 1, wherein the gas injector cover has a bottom surface that is sloped at an angle in a range from 80 degrees to 89 degrees relative to a longitudinal axis of the gas injector cover.

19. The method of claim 7, wherein the gas injector cover has a bottom surface that is sloped at an angle in a range from 1 degree to 10 degrees relative to horizontal.

20. The method of claim 13, wherein the gas injector cover has a bottom surface that is sloped at an angle in a range from 1 degree to 10 degrees relative to horizontal.

* * * * *